United States Patent [19]

Jeng et al.

[11] Patent Number: 5,683,922

[45] Date of Patent: Nov. 4, 1997

[54] METHOD OF FABRICATING A SELF-ALIGNED CONTACT

[75] Inventors: Jason Jeng, Pingtung; Chia-Wen Liang, Hsinchu Hsien, both of Taiwan

[73] Assignee: United Microelectronics Corporation, Hsinchu, Taiwan

[21] Appl. No.: 726,366

[22] Filed: Oct. 4, 1996

[51] Int. Cl.⁶ .................... H01L 21/283; H01L 21/31
[52] U.S. Cl. .................... 437/41 SM; 437/193; 437/195; 437/200; 437/978; 437/984
[58] Field of Search .................... 437/52, 189, 190, 437/192, 193, 195, 200, 978, 984, 228, 41 SM, 240, 241, 60; 156/653.1, 657.1; 257/758, 760, 761

[56] References Cited

U.S. PATENT DOCUMENTS

| | | | |
|---|---|---|---|
| 5,229,326 | 7/1993 | Dennison et al. | 437/195 |
| 5,246,882 | 9/1993 | Hartmann | 437/195 |
| 5,275,972 | 1/1994 | Ogawa et al. | 437/195 |
| 5,436,188 | 7/1995 | Chen | 437/52 |
| 5,478,768 | 12/1995 | Iwasa | 437/52 |

FOREIGN PATENT DOCUMENTS

| | | | |
|---|---|---|---|
| 534130A1 | 3/1993 | European Pat. Off. | 437/984 |
| 3-21030 | 1/1991 | Japan | 437/984 |

*Primary Examiner*—T. N. Quach
*Attorney, Agent, or Firm*—Rabin, Champagne & Lynt, P.C.

[57] ABSTRACT

A method of forming a self-aligned contact for a transistor formed on a substrate. A self-aligned silicide layer is formed on the surface of a source/drain region of the transistor. A silicon oxide/silicon nitride layer is formed over the transistor. Then, a planarization process is performed to fill a trench between gates with, for example, borophosphosilicate glass. In particular, wet etching using a 20:1 buffered oxide etchant is performed to increase the selectivity of the silicon oxide/silicon nitride layer.

11 Claims, 5 Drawing Sheets

METHOD OF FABRICATING A SELF-ALIGNED CONTACT

BACKGROUND OF THE INVENTION

1. Field of the Invention

The invention relates in general to the fabrication of semiconductor integrated circuits (ICs), and more particularly to fabricating a self-aligned contact.

2. Description of the Related Art

As transistor dimensions approach the sub-micron range, conventional contact structures begin to limit device performance in several ways. In particular, the area of the source/drain regions cannot be minimized because the contact hole for these regions must be aligned to these regions with a separate masking step, and extra area for these regions must be allocated to compensate for misalignment tolerances. Also, the larger source/drain region area results in an increased source/drain-to-substrate junction capacitance, which reduces device speed. Therefore, a variety of alternative contact structures have been investigated in an effort to alleviate these problems. The most important that has emerged is the contact structure formed by self-aligned silicides on the source/drain regions. The conventional process of fabricating self-aligned silicides on the source/drain regions is illustrated in detail by the following example of the formation of a self-aligned contact (SAC).

Referring first to FIG. 1A, a single-crystal silicon substrate 102 with a previously formed MOSFET device is provided. Active regions on the substrate 102 are surrounded by field oxide layers, such as the field oxide layer 104 shown, which are typically formed by local oxidation. Each MOSFET device basically includes a gate oxide layer 106, a gate 108, and source/drain regions 110. In particular, the source/drain regions 110 are annealed at about 800° C. Furthermore, sidewall spacers 112 are formed beside the gates 108 to enable the formation of lightly doped drains 110. Because the process for fabricating the above-mentioned elements is well known by those of skill in this art, it is unnecessary to describe the fabrication in detail. Then, salicide (self-aligned silicides on the source/drain regions 110) processing steps are performed so as to form a silicide layer 114 on the top surface of the gate 108 and a silicide layer 116 on the top surface of the source/drain region 110. Next, a film of tetraethyl orthosilicate (TEOS) -based oxide 120, having a thickness of about 1500 Å, is deposited over the substrate and the devices on it. Moreover, a polysilicon layer 122, having a thickness of about 3000 Å, is formed on the TEOS-based oxide layer 120.

Referring now to FIG. 1B, a photoresist layer 124 is formed and patterned to expose the desired contact 126. The polysilicon layer 122 and the TEOS-based oxide layer 120 are then etched to complete the contact via. Reactive ion etching (RIE) technology can be employed to etch the two layers 122 and 120.

Referring to FIG. 1C, after the photoresist layer 124 is removed, another polysilicon layer 128 is formed over the substrate, having a thickness of about 1000 Å. The contact via is thus filled with the polysilicon 128, which makes a conductive connection with the contact 126.

Referring to FIG. 1D, the polysilicon layer 122 and the polysilicon layer 128 are patterned to form a capacitor storage cell 130 for each contact 126. Then, a thin silicon nitride layer 132, followed by a thin oxide layer 134, are formed on the storage cell 130. The silicon nitride layer 132 and the oxide layer 134, together are to serve as the dielectric film between the capacitor electrodes. Furthermore, a polysilicon layer 136 is formed on the oxide layer 134, to serve as opposing electrode of the capacitor. It is known that the surface area of every electrode is preferably maximized, but it is not important to demonstrate this in this example.

Due to the higher integration requirements of modern integrated circuits, the distance between adjacent word lines is to be made as close as possible. Consequently, a deep trench 138, as shown in FIG. 1D, is formed between adjacent gates. After the trench 138 is filled with polysilicon and the polysilicon is further patterned to define the two storage cells, a serious problem develops in the trench. Because the trench is thin and deep, it is difficult to thoroughly remove the undesired polysilicon. Therefore, the adjacent storage cells cannot be separated very well, and thus two capacitors are connected.

One way to reduce the occurrence rate of the above-mentioned phenomenon is to increase the period of over-etching. However, even increasing the over-etching time cannot result in the polysilicon in the trench being totally cleaned, and causes the process to become detailed and complicated. Therefore, a process called planarization of self-aligned contact etching (SAC planarization) has been proposed, which includes deposition of a thick borophosilicate glass (BPSG) layer filling the trench 138 and reflowing of this BPSG layer to planarize the surface. As the SAC planarization is performed prior to the formation of the polysilicon layer which serves as the storage cell, the polysilicon will not fill in the trench between gates.

However, a problem associated with SAC planarization is resulting low selectivity of the silicon oxide/silicon nitride layer by reactive ion etching, which is frequently utilized as an etching technique to open the self-aligned contact. The low selectivity of the silicon oxide/silicon nitride layer results in easy breakage of the dielectric layer located on the surface of the storage cell.

SUMMARY OF THE INVENTION

It is therefore an object of the invention to provide a process for forming a self-aligned contact that is not affected by the above-mentioned drawbacks experienced when utilizing conventional methods.

The invention achieves the above-identified object by providing a new method for forming a self-aligned contact, including the following steps. A field oxide layer is first formed on a semiconductor substrate to define an active region in the semiconductor substrate. A transistor is then formed in the active region, the transistor including a gate oxide film, a gate, and source/drain regions. A film of self-aligned silicide is formed on the source/drain regions. A first dielectric film is then formed over the silicide film. The surface is next planarized by forming a second dielectric layer over the first dielectric film which is much thicker than the first dielectric film. A first polysilicon layer is then formed over the second dielectric layer. The first polysilicon layer is patterned to define self-aligned contact areas. The second dielectric layer is removed by wet etching using a buffered oxide etchant. The first dielectric film is then removed to expose the silicide film on the source/drain regions. A capacitor may then be formed on the silicide film.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1A:
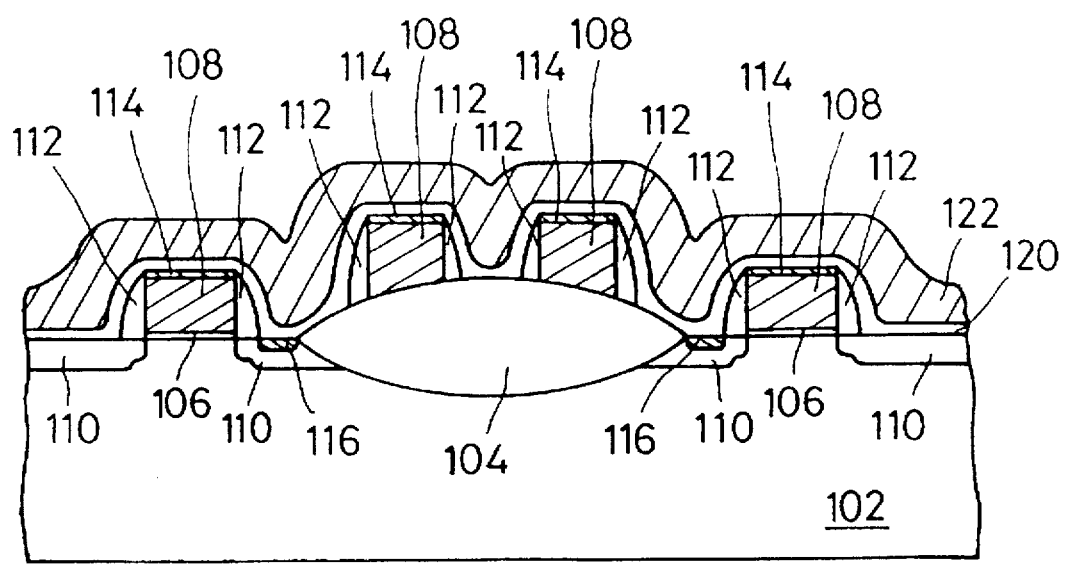
FIGS. 1A to 1D are cross-sectional views illustrating a conventional process for fabricating a SAC for a DRAM.
Figure 1B:
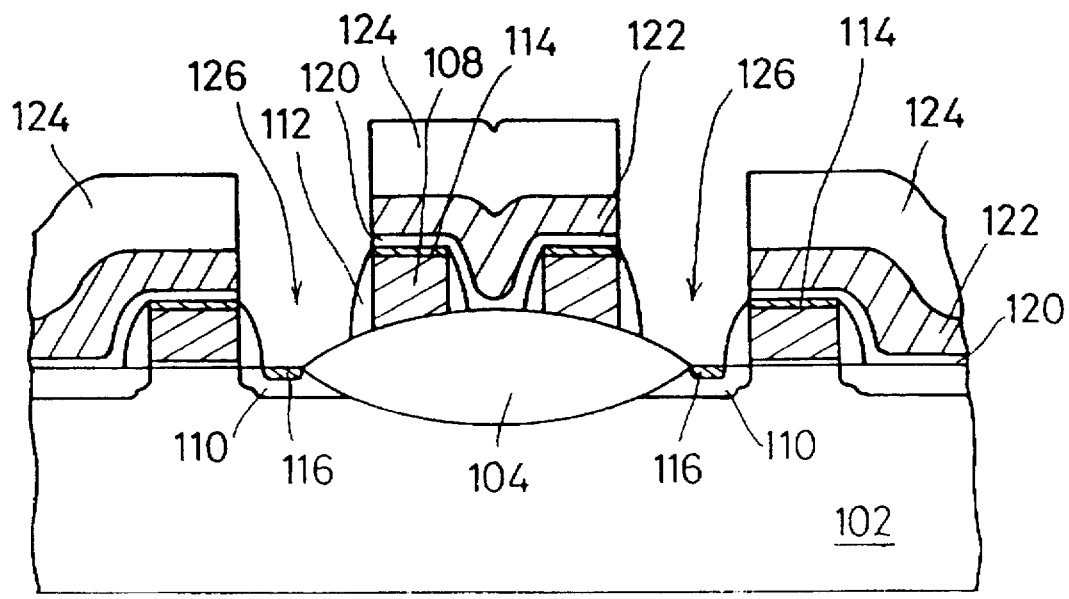
Figure 1C:
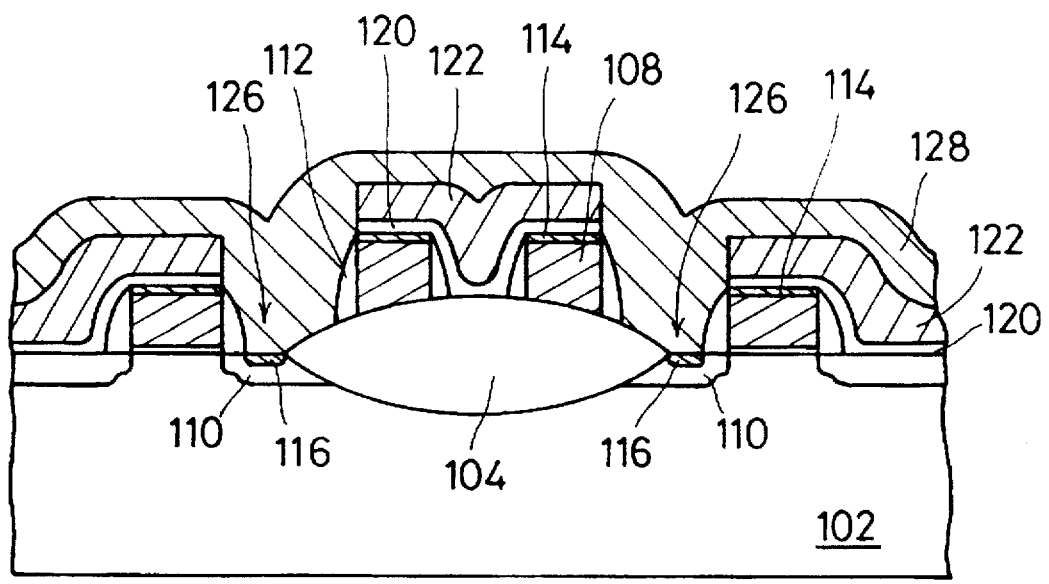
Figure 1D:
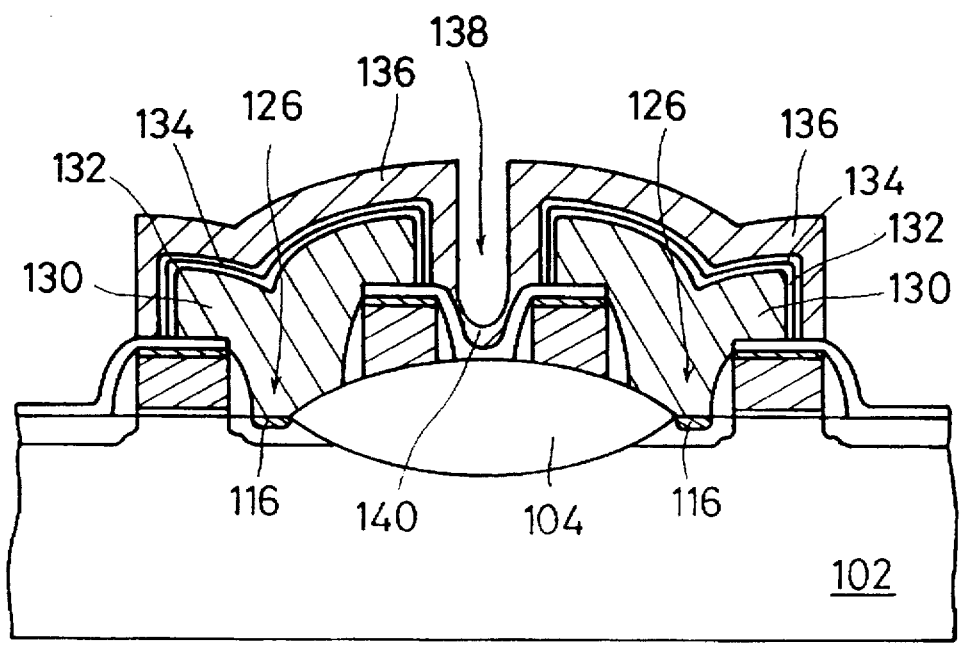
Figure 2A:
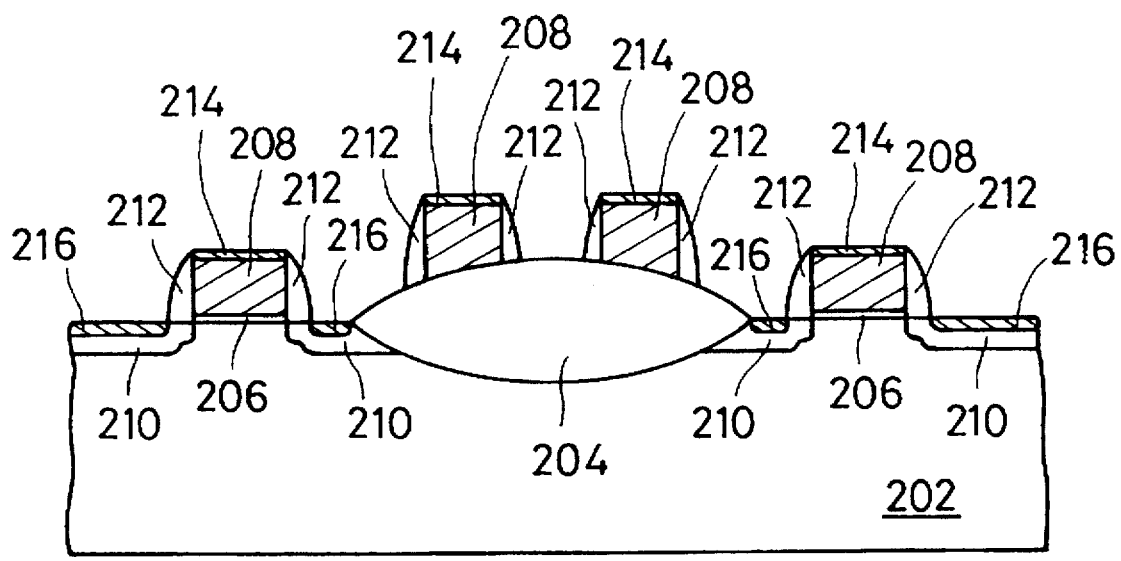
FIGS. 2A to 2E are cross-sectional views illustrating process steps for forming a SAC for a DRAM in accordance with the preferred embodiment of the invention.

Referring first to FIG. 2A, a single-crystal silicon substrate 202 having a previously-formed MOSFET device is provided. Active regions on the substrate 202 are surrounded by field oxide layers, such as the field oxide layer 204 shown, which are typically formed by local oxidation. The MOSFET device basically includes a gate oxide layer 206, a gate 208, and source/drain regions 210. In particular, the source/drain regions 210 are preferably annealed at about 800° C. Furthermore, sidewall spacers 212 are formed beside the gates 208 to enable the formation of lightly doped drains 210. Because the process for fabricating the above-mentioned elements is well known by those of skill in this art, it is unnecessary to describe the fabrication in detail. Then, salicide (self-aligned silicide on the source/drain regions 210) processing steps are performed so as to form a silicide layer 214 on the top surface of the gate 208 and a silicide layer 216 on the top surface of the source/drain region 210.

Figure 2B:
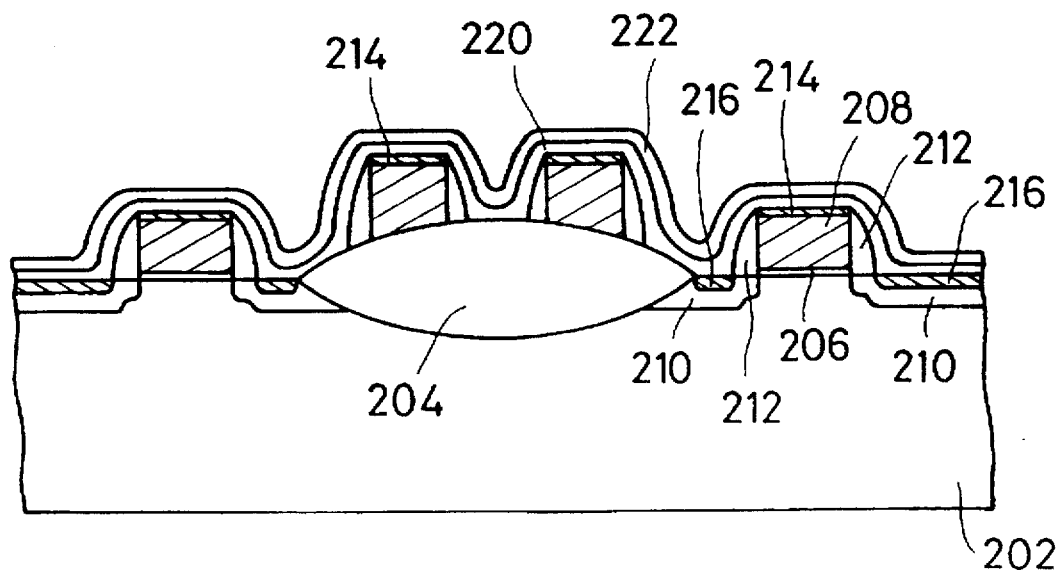

Referring now to FIG. 2B, a film of TEOS-based silicon oxide 220, having a thickness of about 1000 Å, is deposited on the top surface of the substrate 202 and over the preformed MOS devices. Furthermore, a film of silicon nitride 222, having a thickness of about 300 Å, is then deposited over the silicon oxide film 220.

Figure 2C:
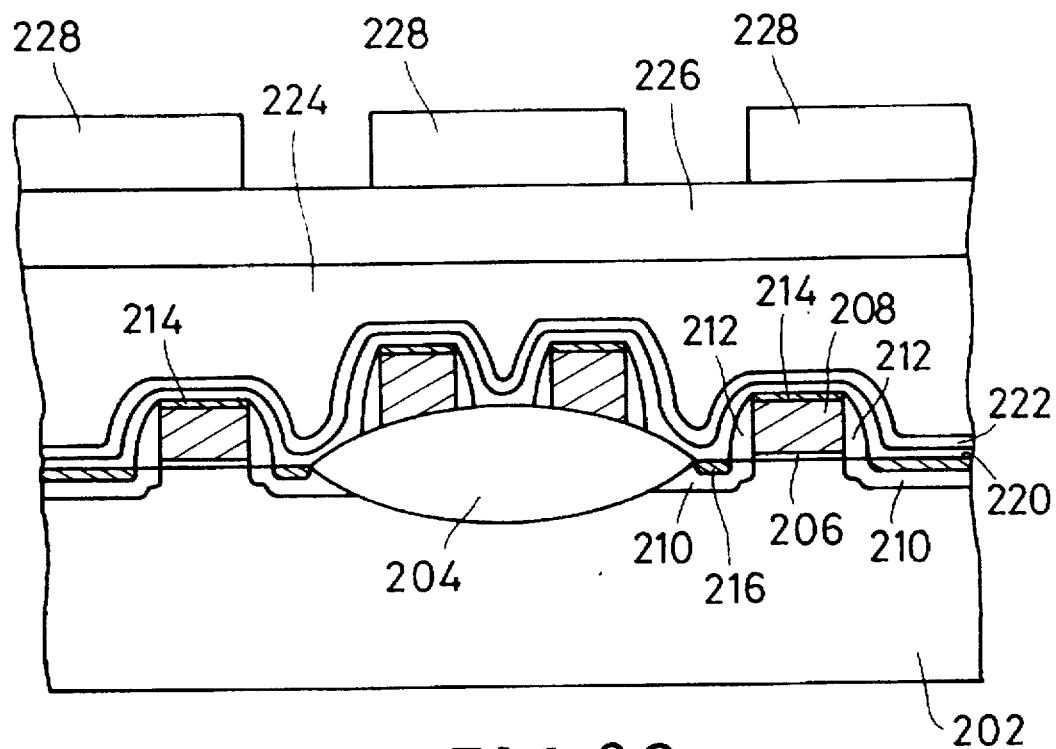

Referring to FIG. 2C, a thick layer of borophosphosilicate glass (BPSG) 224 is deposited over the silicon nitride film 222 to a thickness of about 2000 Å, and is reflowed at about 800° C. to planarize the surface of the substrate. A polysilicon layer 226 having a thickness of about 3000 Å is then deposited on the planarized BPSG layer 224. Next, a photoresist layer 228 is formed on top of the polysilicon layer 226 and is patterned in order to define the regions to etch vias to the predetermined self-aligned contacts above the silicide layers 216.

Figure 2D:
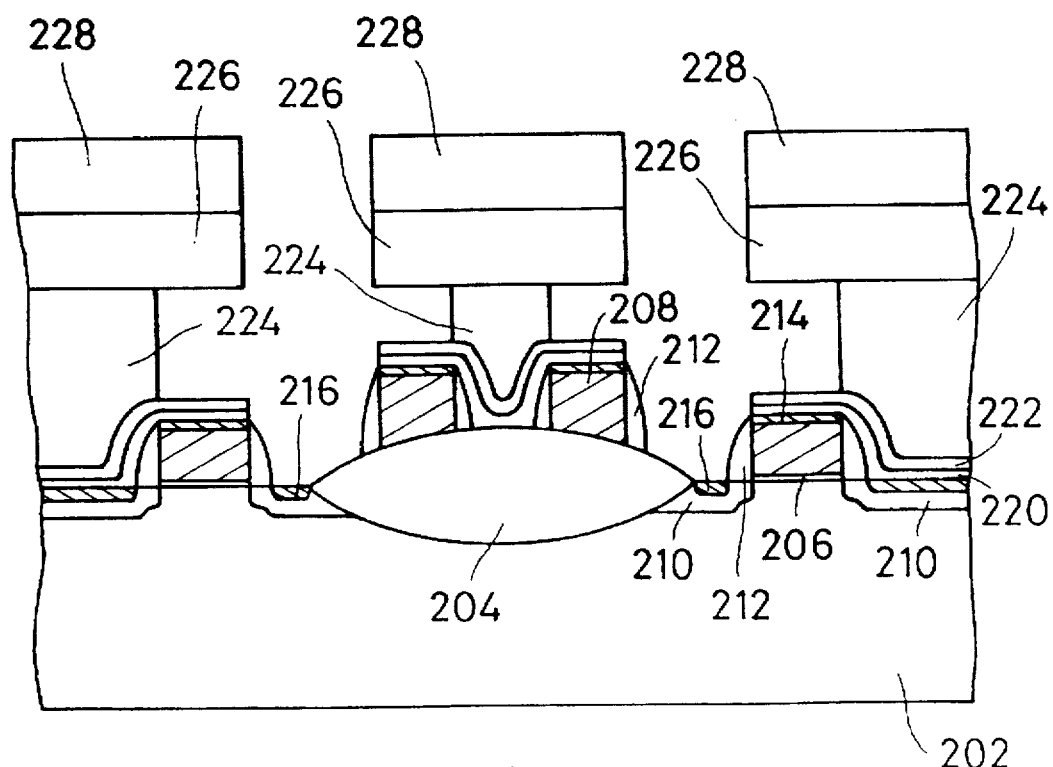

Referring to FIG. 2D, the polysilicon layer 226 is anisotropically etched in accordance with the patterned photoresist layer 228. Then, a wet etching process is performed using a 20:1 buffered oxide etchant (BOE) to etch the BPSG layer 224 isotropically, leaving a portion of the BPSG layer 224 remaining in the trench formed between the gates on the field oxide layer 204. Next, the TEOS-based silicon oxide 220 and the silicon nitride layer 222 are etched to expose the silicide layers 216 as self-aligned contacts, by RIE in accordance with the patterned photoresist layer 228 and the patterned polysilicon 226.

Figure 2E:
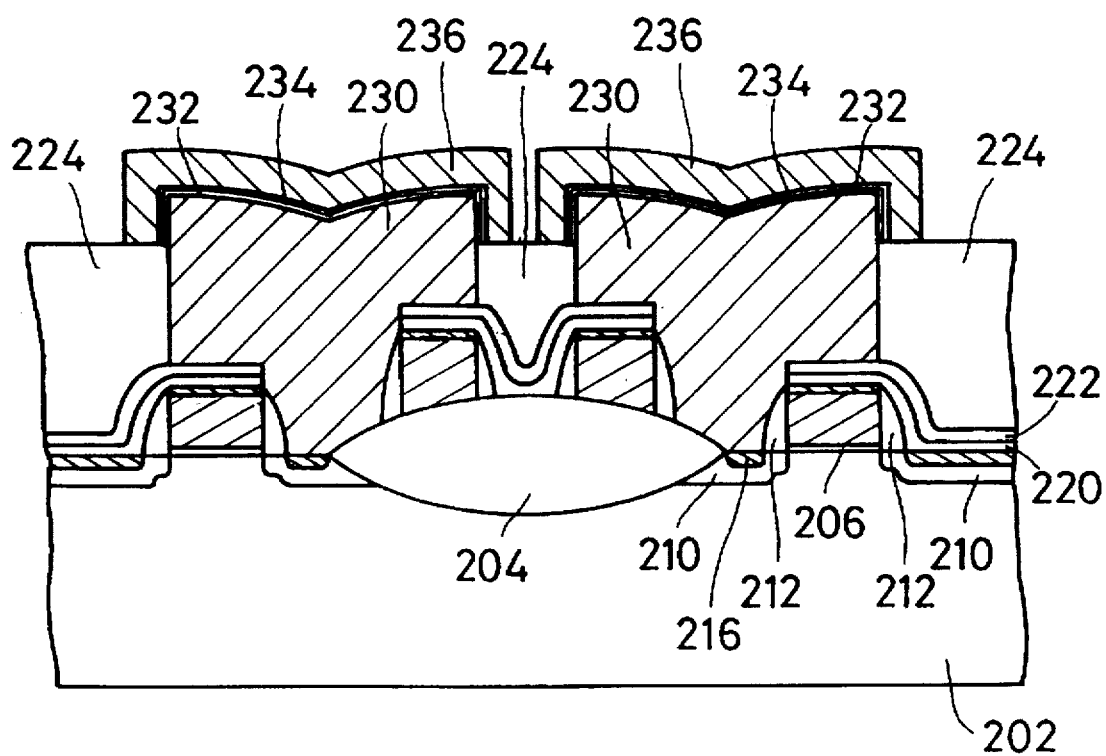

Referring to FIG. 2E, after the photoresist layer 228 is removed, a polysilicon layer 230 is formed to a thickness of about 1000 Å. This polysilicon layer, together with the polysilicon layer 226, are defined to form a polysilicon layer 230 in a pattern desired for a capacitor storage cell. Then, a dielectric film, preferably including a thin silicon nitride layer 232 on the bottom and a thin oxide layer 234 on the top, is formed on the storage cell. Finally, a polysilicon layer 236 as an opposing electrode is formed and patterned. Now the capacitor is complete, and includes the polysilicon layer 230 serving as a storage cell, the polysilicon layer 236 serving as an opposing electrode and the thin silicon nitride layer 232 and the thin oxide layer 234 serving as dielectric layers between the storage cell and the opposing electrode. It is well known by persons skilled in the art that the storage cell is ideally designed to have a maximum surface area, and that the materials used to form the storage cell, electrode, and dielectric layers can be variable. Thus, the pattern and composition of the capacitor will not be described in detail.

Several advantages are achieved by the invention, including:

1. The selectivity of the silicon oxide/silicon nitride layer is highly improved by the 20:1 wet etching. Therefore, the dielectric layer between the storage cell and the opposing electrode will not break down.
2. The method of the invention for fabricating a self-aligned contact for a dynamic random access memory device results in an increase in capacitance because the isotropic etching of the BPSG layer creates a larger space for the formation of the capacitor.

While the invention has been described by way of example and in terms of a preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a self-aligned contact, comprising the steps of:

forming a field oxide layer on a semiconductor substrate to define an active region in the semiconductor substrate;

forming a transistor in the active region, the transistor including a gate oxide film, a gate, and a source/drain region;

forming a film of self-aligned silicide on the source/drain region;

forming a first dielectric film over the silicide film;

planarizing the surface by forming, over the first dielectric film, a second dielectric layer which is much thicker than the first dielectric film;

forming a first polysilicon layer over the second dielectric layer;

patterning the first polysilicon layer in order to define a self-aligned contact area;

removing the second dielectric layer by wet etching using a buffered oxide etchant; and removing the first dielectric film to expose the silicide film.

2. A method according to claim 1, wherein the first dielectric film includes a tetraethyl orthosilicate (TEOS)-based silicon oxide film and a silicon nitride film.

3. A method according to claim 2, wherein said step of forming the first dielectric film includes the step of depositing the silicon nitride film to a thickness of about 300 Å.

4. A method according to claim 2, wherein said step of forming the first dielectric film includes the step of depositing the TEOS-based silicon oxide film to a thickness of about 1000 Å.

5. A method according to claim 1, wherein the second dielectric layer is borophosphosilicate glass (BPSG).

6. A method according to claim 5, wherein said step of forming a second dielectric layer includes the step of depositing the BPSG layer to a thickness of about 2000 Å.

7. A method according to claim 5, further including the step of reflowing the BPSG at a temperature of about 800° C. to planarize the surface.

8. A method according to claim 5, wherein said step of removing the second dielectric layer includes the step of etching the BPSG layer using a 20:1 buffered oxide etchant.

9. A method according to claim 1, wherein the first polysilicon layer is deposited to a thickness of about 3000 Å.

10. A method according to claim 1, wherein said step of removing the first dielectric film includes the step of etching the first dielectric film by reactive ion etching.

11. A method according to claim 1, wherein the first dielectric film includes a silicon nitride layer and a silicon oxide layer.

* * * * *